United States Patent [19]

Fulmer et al.

[11] Patent Number: 4,723,302
[45] Date of Patent: Feb. 2, 1988

[54] METHOD AND APPARATUS FOR DETERMINING CHANNEL RECEPTION OF A RECEIVER

[75] Inventors: Allen L. Fulmer, Clearwater; Kenneth J. Frett, Crystal Beach, both of Fla.

[73] Assignee: A. C. Nielsen Company, Northbrook, Ill.

[21] Appl. No.: 893,183

[22] Filed: Aug. 5, 1986

[51] Int. Cl.⁴ .......................................... H04B 17/00
[52] U.S. Cl. ...................................... 455/2; 455/161; 455/186; 455/226; 358/84
[58] Field of Search ............... 455/161, 166, 182, 185, 455/186, 2, 226; 358/84

[56] References Cited

U.S. PATENT DOCUMENTS

| | | | |
|---|---|---|---|
| 3,864,636 | 2/1975 | Fukuda et al. | 455/182 |
| 4,020,419 | 4/1977 | Caspari et al. | 455/182 |
| 4,044,376 | 8/1977 | Porter | 455/2 |
| 4,216,497 | 8/1980 | Ishmen et al. | 455/2 |
| 4,425,578 | 1/1984 | Haselwood et al. | 358/84 |
| 4,577,220 | 3/1986 | Laxton et al. | 455/2 |

*Primary Examiner*—Jin F. Ng
*Attorney, Agent, or Firm*—Mason, Kolehmainen, Rathburn & Wyss

[57] ABSTRACT

A method and apparatus for identifying a channel to which a receiver is tuned sequentially detects a signal of the receiver and stores a characteristic value of the detected signal for a predefined sequence of frequencies. The stored values corresponding to the predetermined channels of the receiver are identified and assigned a predetermined value. The stored values corresponding to each of a plurality of harmonic frequencies of the predetermined channels are identified and assigned one of a plurality of different predetermined values. A total assigned value is then calculated for each of the predetermined channels with the corresponding values for the identified harmonic frequencies thereof. The calculated total values are then compared to identify a maximum value corresponding to the channel to which the receiver is tuned.

20 Claims, 2 Drawing Figures

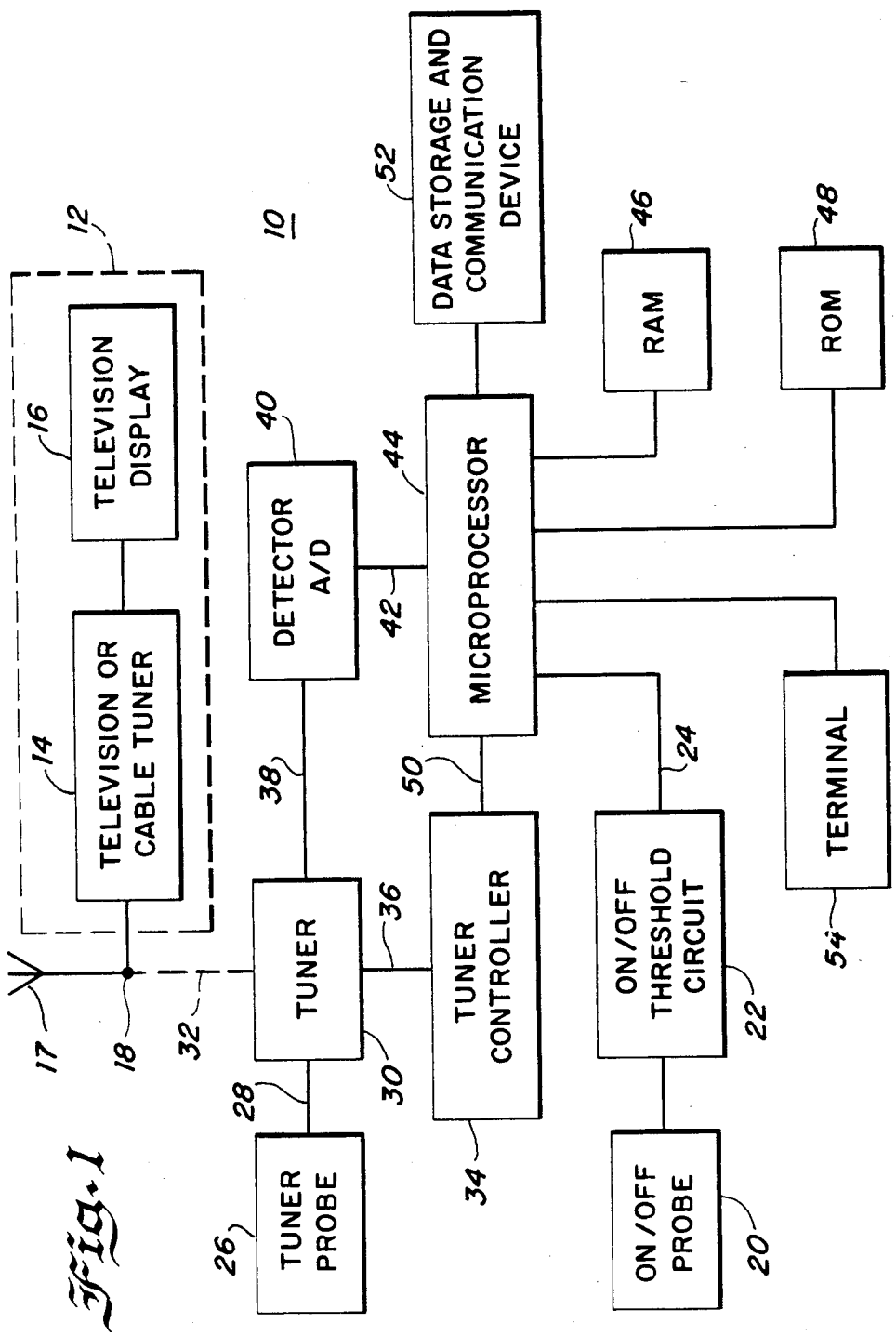

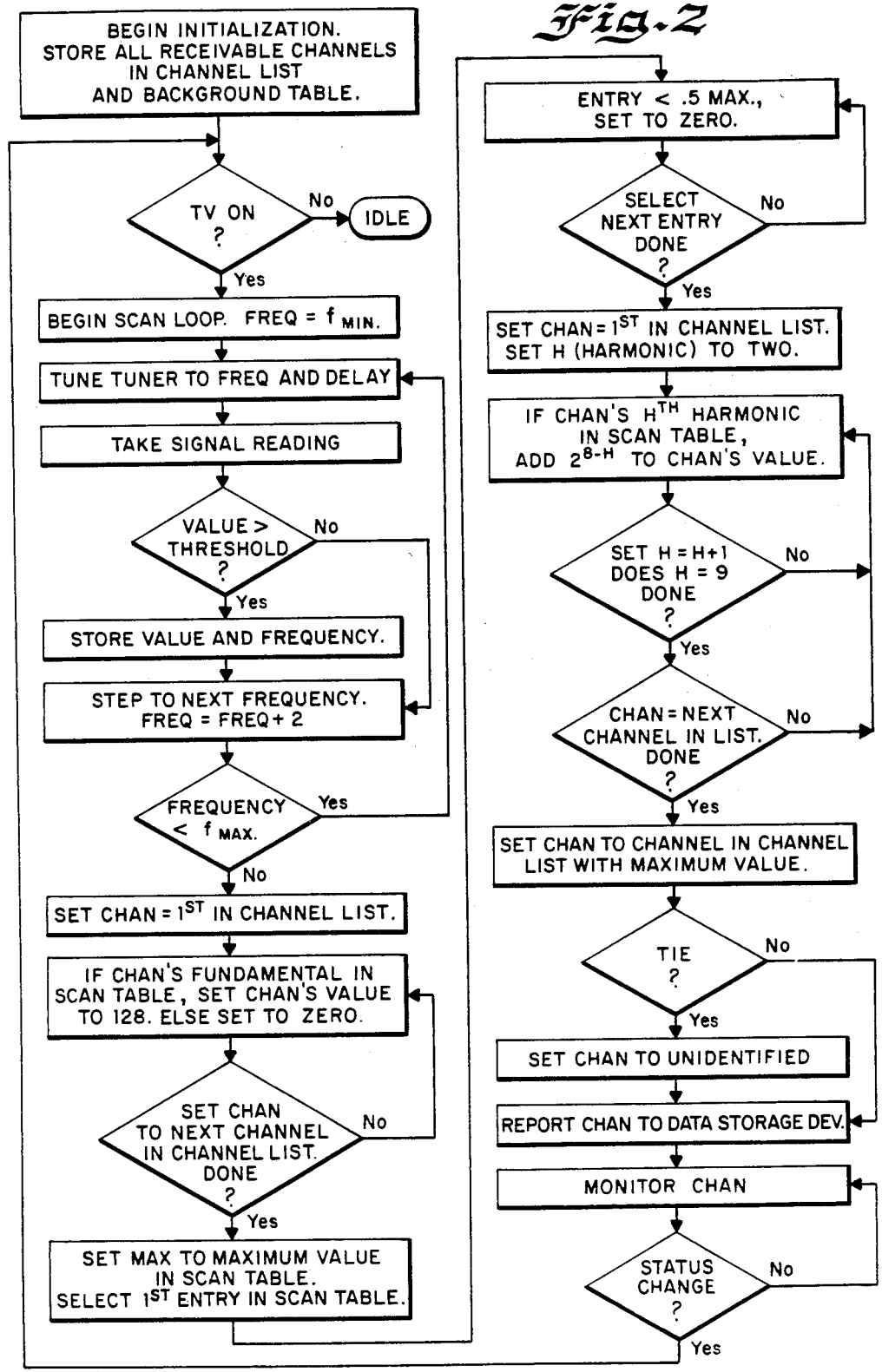

METHOD AND APPARATUS FOR DETERMINING CHANNEL RECEPTION OF A RECEIVER

BACKGROUND OF THE INVENTION

1. Field of the Invention

This invention relates generally to a method and apparatus for monitoring receivers, and more particularly to a method and apparatus for determining the channel to which a receiver is tuned.

2. Description of the Prior Art

Various arrangements have been employed to determine the channel to which a television receiver is tuned. A disadvantage of many known monitoring arrangements is that an internal connection to the television receiver is required. For example, U.S. Pat. No. 3,973,206 issued to Haselwood, et al. on Aug. 3, 1976 discloses a method of determining channel tuning by monitoring the varactor diode tuning voltage and thus, required internal connections in the television receiver.

Another method for determining channel tuning disclosed in U.S. Pat. No. 4,425,578 issued to Haselwood et al. on Jan. 10, 1984 utilizes a signal injection source and a detector/receiver arranged to detect the combined signal from the injection signal source and a video carrier to which the video receiver is tuned. A significant drawback of signal injection monitoring arrangements is potential interference with the functional operation of the video receiver being monitored.

Other known arrangements have utilized a local oscillator frequency measurement of the monitored receiver to determine channel tuning. However, known local oscillator measurement arrangements are prone to errors caused by extraneous signals.

SUMMARY OF THE INVENTION

It is an object of the present invention to provide a method and apparatus for determining the channel of a plurality of predetermined channels to which a receiver is tuned that overcome many of the disadvantages of prior art systems.

Therefore, in accordance with a preferred embodiment of the invention, there are provided method and apparatus for determining the channel of a plurality of predetermined channels to which a receiver is tuned. The receiver is monitored to detect the occurrence of a predetermined operational mode change in the receiver, for example, when the receiver is turned on or off or when the receiver is tuned to a different one of the receiver channels. Once a predetermined operational mode change of the receiver is detected, a signal of the monitored receiver is detected and a characteristic value of the detected signal is stored for a predetermined sequence of frequencies. Stored values corresponding to the predetermined channels are identified and assigned a predetermined value. Subsequently, stored values corresponding to each of a plurality of harmonic frequencies of the predetermined channels are identified and assigned one of a plurality of different predetermined values. A total assigned value is then calculated for the predetermined channels with the corresponding values for the identified harmonic frequencies thereof. The calculated total values are then compared to identify a maximum value corresponding to the channel to which the receiver is tuned.

DESCRIPTION OF THE DRAWING

These and other objects and advantages of the present invention will become readily apparent upon consideration of the following detailed description and attached drawings wherein:

FIG. 1 a block diagram of the channel detection apparatus according to the present invention; and FIG. 2 is a flow chart illustrating the logical steps performed by the apparatus of FIG. 1.

DETAILED DESCRIPTION OF THE PREFERRED EMBODIMENT

Referring now to the drawing, with particular attention to FIG. 1, there is illustrated a block diagram of a new and improved channel detection apparatus according to the invention generally designated by the reference numeral 10. While the channel detection apparatus 10 is depicted and generally described herein for monitoring a television receiver, the principles of the present invention disclosed herein are also applicable to broadcast radio receivers and other receivers.

A television receiver 12 includes a tuner 14 that may be an internal television tuner or an external cable tuner and a television display 16. In a typical installation, the receiver 12 receives signal from a receiving antenna 17, or in many instances from a cable television system that is connected to a conventional signal input 18. The channel detection system 10 includes a detector or ON/OFF probe 20 for monitoring the operational mode of the receiver 12. Various conventional detectors can be employed for the ON/OFF probe 20, for example, the probe 20 may include tuned circuitry for detecting a characteristic frequency of the horizontal retrace oscillator in the television display 16. Alternatively, the probe 20 can include current monitoring circuitry for measuring the current used by the receiver 14. An ON/OFF threshold circuit 22 is used in conjunction with the ON/OFF probe 20 to provide a signal at a line 24 corresponding to the on and off operational functions of the receiver 12.

The channel detection apparatus 10 includes a detector or tuner probe 26 for sensing a radiated signal from the monitored tuner 14 and providing an output at a line 28 to a tuner 30. The tuner probe 26 may include inductive or capacitive circuitry to pick up the local oscillator signal of the tuner 14. Alternatively, a direct connection to the signal input 18 of the receiver 12 may be used as shown in broken line 32 may be used to obtain the local oscillator signal. A tuner controller 34 applies a signal at a line 36 for controlling the frequency to which the tuner 30 is tuned. The tuner 30 is sequentially tuned to different frequencies within a predetermined set of frequencies. This predetermined set of frequencies includes local oscillator frequencies of the tuner 14 corresponding to the various channels to which the tuner 14 may be tuned as well as predetermined harmonic frequencies of each of the fundamental local oscillator frequencies of the tuner 14. Various commercially available tuners may be used for the tuner 30 such as, for example, a tuner type VTY-1U33 manufactured and sold by Sharp, Inc. The tuner controller 34 can be implemented with various integrated circuit devices such as a Signetics integrated circuit device SAB3036. A detector and analog-to-digital (A/D) converter are coupled to an output of the tuner 30 at a line 38 and provide digital representations of the amplitudes of the detected signals received from the tuner 14.

The channel detection apparatus 10 includes a processor device such as a microprocessor 44 and associated memory devices, such as a random access memory RAM 46 for data storage, and a read only memory ROM 48 for program storage. Various commercially available microprocessor devices can be utilized for the microprocessor 44 such as, for example, an RCA microprocessor type 1805 or a Motorola, Inc. microprocessor device 68HC11. The microprocessor 44 receives the output signal from the ON/OFF threshold circuit 22 via line 24 and the output of the detector and A/D converter combination 40 via line 42. The microprocessor 44 applies a control signal via line 50 to the tuner controller 34.

A data storage and communication device 52 takes the data from the microprocessor 44 via one of various known communication methods and stores said data for subsequent retrieval, usually via a telephone line connected to the public switched telephone network, by a central computer system (not shown). A terminal 54 is coupled to the microprocessor 44 to enable testing.

The operation of the channel detection apparatus 10 will now be described with reference to the flow chart shown in FIG. 2. When the channel detection apparatus 10 is first installed, an initialization procedure is performed in conjunction with the receiver 12. The initialization procedure includes sequentially determining all of the fundamental local oscillator and harmonics thereof that correspond to each of the channels that may be received by the television receiver. This is accomplished by tuning the tuner 14 to each channel and storing the corresponding detected signal from the detector and A/D converter 40 for each tuned channel within the RAM 46 to form a channel list.

Next, the tuner 30 sequentially scans a predetermined set of frequencies which includes each channel in the channel list and a plurality of harmonic frequencies thereof, for example the second through the eighth harmonic frequency for each channel of the monitored receiver 12. The amplitude of the background noise from the detector 40 is stored within the RAM 46 to form a background table to establish a noise floor which may be later used as a threshold value for each channel. Once this initialization procedure is completed, the channel detection apparatus is ready for monitoring the receiver 12.

The microprocessor 44 monitors the ON/OFF signal (line 24, FIG. 1) to determine when the receiver 12 is turned on. Once an ON signal is detected, the microprocessor 44 provides a signal (line 50, FIG. 1) to the tuner controller 34 to begin the scanning sequence. The scanning sequence begins with the tuner 30 set to the lowest frequency, for example 95 MHz and the detected signal output of the detector 40 is compared to a predetermined threshold value. If the amplitude of the detected signal from the detector 40 is greater than the predetermined threshold value, the detected amplitude is stored for the particular frequency. Then the tuner 30 is set to the next frequency within the set of frequencies and the above sequential steps are repeated. Otherwise, when the detected amplitude is less than the predetermined threshold value, the tuner 30 is set to the next frequency within the set of frequencies and the sequential steps are repeated for the next set frequency.

These sequential steps are repeated until the next frequency is identified as being greater than 935 MHz, the exampled highest frequency within the predetermined range of frequencies. The thus detected values are stored within the RAM 46 to form a scan table. The scan table values are compared to the stored channel list to identify scan table values that correspond to the channels of the receiver 12. If the channels are identified in the stored scan table, a predetermined value, for example, such as $2^7$ or 128 is assigned to the identified channel. Otherwise, if any of the channels are not stored in the scan table, a zero value is assigned for those channels.

Then, the scan table values are filtered. A maximum stored value within the scan table values is identified. This identified maximum stored value is multiplied by a predefined scalar, for example, one-half to obtain a scalar maximum value. The stored data values in the scan table are then compared to this scalar maximum value. Stored scan table values that are less than the scalar maximum value are eliminated or assigned a zero value.

Next, stored values in the scan table are identified that correspond to a series of harmonic frequencies between the second harmonic frequency and the eighth harmonic frequency of the local oscillator frequency for the channels in the channel list. For stored values corresponding to one of these harmonic frequencies, one of a corresponding series of predetermined values is assigned. This series of predetermined values may be, for example, equal to $2^{8-H}$ wherein H represents the particular harmonic. So that for the second harmonic frequency the value of $2^6$ or 64 is assigned. Similarly, a value of $2^5$ or 32 is assigned for the third harmonic frequency, $2^4$ or 16 is assigned for the fourth harmonic frequency, $2^3$ or 8 is assigned for the fifth harmonic frequency, $2^2$ or 4 is assigned for the sixth harmonic frequency, $2^1$ or 2 is assigned for the seventh harmonic frequency, and $2^0$ or 1 is assigned for the eighth harmonic frequency.

A total assigned value is calculated for each of the channels of the receiver 14 together with the corresponding values assigned for the identified harmonic frequencies thereof. The channel having the highest calculated value is identified as the channel to which the receiver 14 is tuned. In the case of a tie, when two of the fundamental channel frequencies have the same calculated total assigned value, the viewed channel is stored as unidentified and reported via the communications device 52 as unidentified. Otherwise, the identified fundamental channel is reported via communication device 52.

After a channel has been identified, the tuner 30 is tuned to the local oscillator frequency of the identified channel or alternatively to the lowest detected harmonic frequency of the identified channel. When this monitored signal decreases, thus indicating a channel change, the above-described sequence is repeated to determine the new channel to which the receiver 14 is tuned.

Although the present invention has been described in connection with details of the preferred embodiment, many alterations and modifications may be made without departing from the invention. Accordingly, it is intended that all such alterations and modifications be considered as within the spirit and scope of the invention as defined in the appended claims.

What is claimed and desired to be secured by Letters Patent is:

1. A method for determining the channel of a plurality of predetermined channels to which a receiver is tuned comprising the steps of:

sequentially detecting a signal of the receiver and storing a characteristic value of the detected signal for a predefined sequence of frequencies;

identifying stored values corresponding to the predetermined channels and assigning a predetermined value;

identifying stored values corresponding to each of a plurality of harmonic frequencies of the predetermined channels and assigning one of a plurality of predetermined values, wherein said plurality of predetermined values correspond to separately determined values according to each of the plurality of harmonic frequencies;

calculating a total assigned value for each of the predetermined channels with said corresponding values for identified harmonic frequencies thereof; and comparing said calculated total assigned values to identify a maximum value.

2. A method as recited in claim 1 wherein said step of sequentially detecting a signal of the receiver and storing a characteristic value of the detected signal for a predefined sequence of frequencies, includes the steps of comparing said detected signal with a predetermined threshold signal and ignoring detected signals that are less than said predetermined threshold signal.

3. A method as recited in claim 1 wherein said step of identifying stored values corresponding to the predetermined channels and assigning a predetermined value includes the steps of identifying a maximum stored value, multiplying said identified maximum stored value with a predefined scalar to obtain a scalar maximum value, comparing said stored values with said scalar maximum value and eliminating stored values that are less than said scalar value.

4. A method as recited in claim 3 wherein said predefined scalar equals one-half.

5. A method as recited in claim 1 wherein said step of identifying stored values corresponding to each of a plurality of harmonic frequencies of the predetermined channels and assigning one of a plurality of predetermined values includes the steps of identifying stored values corresponding to a series of harmonic frequencies between the second harmonic frequency and the eighth harmonic frequency of each of the predetermined channels and assigning one of a corresponding series of predetermined decreasing values.

6. A method as recited in claim 1 further including the step of detecting the occurrence of a predetermined operational mode change of the receiver.

7. A method as recited in claim 6 wherein said step of detecting the occurrence of a predetermined operational mode change of the receiver includes detecting a channel change of the receiver and detecting a turn-on of the receiver.

8. Apparatus for determining the channel of a plurality of predetermined channels to which a receiver is tuned, each of the predetermined channels having a fundamental frequency comprising:

means for sequentially detecting a signal of the receiver and means for storing a characteristic value of the detected signal for a predefined sequence of the frequencies;

means for identifying stored values corresponding to the predetermined channels and means for assigning a predetermined value;

means for identifying stored values corresponding to each of a plurality of harmonic frequencies of the predetermined channels and means for assigning one of a plurality of predetermined values, wherein said plurality of predetermined values correspond to separately determined values according to each of the plurality of harmonic frequencies;

means for calculating a total assigned value for each of the predetermined channels with said corresponding values for identified harmonic frequencies thereof; and means for comparing said calculated total assigned values to identify a maximum value.

9. Apparatus as recited in claim 8 wherein said means for sequentially detecting a signal of the receiver and means for storing a characteristic value of the detected signal for a predefined sequence of frequencies, includes means for comparing said detected signal with a predetermined threshold signal and means for ignoring detected signals that are less than said predetermined threshold signal.

10. Apparatus as recited in claim 8 wherein said means for identifying stored values corresponding to the predetermined channels and assigning a predetermined value includes means for identifying a maximum stored value, means for multiplying said identified maximum stored value with a predefined scalar to obtain a scalar maximum value, means for comparing said stored values with said scalar maximum value and means for eliminating stored values that are less than said scalar value.

11. Apparatus as recited in claim 10 wherein said predefined scalar equals one-half.

12. Apparatus as recited in claim 8 wherein said means for identifying stored values corresponding to each of a plurality of harmonic frequencies of the predetermined channels and means for assigning one of a plurality of predetermined values includes means for identifying stored values corresponding to a series of harmonic frequencies between the second harmonic frequency and the eighth harmonic frequency of the predetermined channels and means for assigning one of a corresponding series of predetermined decreasing values.

13. Apparatus as recited in claim 8 further including means for detecting the occurrence of a predetermined operational mode change of the receiver.

14. Apparatus as recited in claim 13 wherein said means for detecting the occurrence of a predetermined operational mode change of the receiver includes means for detecting a channel change of the receiver and means for detecting a turn-on of the receiver.

15. Apparatus for determining the channel of a plurality of predetermined channels to which a receiver is tuned, each of the predetermined channels having a fundamental frequency comprising:

tuning means for generating a predefined sequence of different frequency signals, said generated signals including the frequencies of the predetermined channels and a plurality of harmonic frequencies of each of the predetermined channels;

means responsive to said tuning means for detecting a signal of a local oscillator of the receiver;

means for storing a characteristic value of said detected signals;

means for identifying stored values corresponding to the predetermined channels and means for assigning a predetermined value;

means for identifying stored values corresponding to each of the plurality of harmonic frequencies of the predetermined channels and means for assigning one of a plurality of predetermined values, wherein said plurality of predetermined values correspond to separately determined values according to each of the plurality of harmonic frequencies;

means for calculating a total assigned value for each of the predetermined channels with said corresponding values for identified harmonic frequencies thereof; and means for comparing said calculated total assigned values to identify a maximum value.

16. Apparatus as recited in claim 15 further including means for detecting the occurrence of a predetermined operational mode change of the receiver.

17. Apparatus as recited in claim 16 wherein said means for detecting the occurrence of a predetermined operational mode change of the receiver includes means for detecting a channel change of the receiver and means for detecting a turn-on of the receiver.

18. Apparatus as recited in claim 15 wherein said means for storing a characteristic value of said detected signals includes means for comparing said detected signal with a predetermined threshold signal and means for ignoring detected signals that are less than said predetermined threshold signal.

19. Apparatus as recited in claim 15 wherein said means for identifying stored values corresponding to the predetermined channels and assigning a predetermined value includes means for identifying a maximum stored value, means for multiplying said identified maximum stored value with a predefined scalar to obtain a scalar maximum value, means for comparing said stored values with said scalar maximum value and means for eliminating stored values that are less than said scalar value.

20. Apparatus as recited in claim 15 wherein said means for identifying stored values corresponding to each of a plurality of harmonic frequencies of the predetermined channels and means for assigning one of a plurality of predetermined values includes means for identifying stored values corresponding to a series of harmonic frequencies between the second harmonic frequency and the eighth harmonic frequency of the predetermined channels and means for assigning one of a corresponding series of predetermined decreasing values.

* * * * *